United States Patent
Rosenblatt et al.

(10) Patent No.: US 9,837,491 B2
(45) Date of Patent: *Dec. 5, 2017

(54) STACKED CARBON NANOTUBE MULTIPLE THRESHOLD DEVICE

(71) Applicant: International Business Machines Corporation, Armonk, NY (US)

(72) Inventors: Sami Rosenblatt, White Plains, NY (US); Rasit O Topaloglu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/224,480

(22) Filed: Jul. 29, 2016

(65) Prior Publication Data

US 2017/0170267 A1     Jun. 15, 2017

Related U.S. Application Data

(63) Continuation of application No. 14/964,499, filed on Dec. 9, 2015, now Pat. No. 9,472,773.

(51) Int. Cl.
*H01L 29/06* (2006.01)
*H01L 29/423* (2006.01)
*B82Y 10/00* (2011.01)

(52) U.S. Cl.
CPC .... *H01L 29/0673* (2013.01); *H01L 29/42392* (2013.01); *B82Y 10/00* (2013.01); *Y10S 977/75* (2013.01); *Y10S 977/938* (2013.01)

(58) Field of Classification Search
CPC ........... H01L 29/0673; H01L 29/42392; H01L 51/0562; H01L 51/0048; H01L 51/0541
(Continued)

(56) References Cited

U.S. PATENT DOCUMENTS 6,566,704 B2   5/2003   Choi et al.
7,453,728 B2 * 11/2008  Noguchi ............ G11C 16/0483
                                                      365/185.09
(Continued)

FOREIGN PATENT DOCUMENTS

JP       2008192706 A    2/2007

OTHER PUBLICATIONS

Arnold et al.,"Sorting carbon nanotubes by electronic structure using density differentiation", nature nanotechnology, vol. 1, Oct. 2006, pp. 60-65.
(Continued)

*Primary Examiner* — Tu-Tu Ho
(74) *Attorney, Agent, or Firm* — Jeffrey S LaBaw; Steven J. Meyers

(57) ABSTRACT

A device structure including a gate structure containing a first layer of carbon nanotubes and a second layer of carbon nanotubes. The first and the second layers are stacked vertically. The first and the second layers have carbon nanotubes which have substantially homogeneous electric characteristics within each layer. The carbon nanotubes in the first layer have different electric characteristics than the carbon nanotubes in the second layer, so that the device structure exhibits a multiple threshold behavior when coupled to a voltage source. The disclosure also includes a method for fabricating a multithreshold device structure.

18 Claims, 11 Drawing Sheets

(58) Field of Classification Search
USPC .......................................................... 257/29
See application file for complete search history.

(56) References Cited

U.S. PATENT DOCUMENTS

| | | | |
|---|---|---|---|
| 8,101,953 | B2 | 1/2012 | Jiang et al. |
| 8,513,099 | B2 | 8/2013 | Chang et al. |
| 8,772,782 | B2 | 7/2014 | Cao et al. |
| 8,895,371 | B2 | 11/2014 | Cao et al. |
| 8,946,789 | B2 | 2/2015 | Kim et al. |
| 9,472,773 | B1 * | 10/2016 | Rosenblatt .......... H01L 51/0562 |
| 2008/0026532 | A1 | 1/2008 | Duan et al. |
| 2013/0181274 | A1 | 7/2013 | Saitoh et al. |
| 2014/0127584 | A1 | 5/2014 | Kim et al. |

OTHER PUBLICATIONS

Soregenfrei et al., "Controlled dielectrophoretic assembly of carbon nanotubes using real-time electrical detection", Feb. 2, 2009, Applied Physics Letters 94, (2009), pp. 053105-1-053105-3.

Wang et al., "Tuning the threshold voltage of carbon nanotube transistors by n-type molecular doping for robust and flexible complementary circuits", Apr. 1, 2014, PNAS, vol. 111, No. 13,pp. 4776-4781.

Zhao et al., "Pyrenecyclodextrin-decorated single-walled carbon nanotube field-effect transistors as chemical sensors", 2008, Advanced Materials, 20, pp. 1910-1915.

Liu et al., "Chemical functionalization of single-walled carbon nanotube field-effect transistors as switches and sensors", 2010, Coordination Chemistry Reviews 254 (2010), pp. 1101-1116.

Zhao et al., "Electronic Properties of Carbon Nanotubes with Covalent Sidewall Functionalization", 2004, J. Phys. Chem. B 2004, 108, pp. 4227-4230.

Nosho et al., "n-type carbon field-effect transistors fabricated by using Ca contact electrodes", Applied Physics Letters 86 (2005), pp. 073105-1-073105-3.

Maiti et al., "25th Anniversary Article: Chemically Modified/Doped Carbon Nanotubes & Graphene for Optimized Nanostructures & Nanotubes", Advanced Materials, 2013, pp. 1-27.

Kang et al., "High Performance Electronics Based on Dense, Perfectly Aligned Arrays of Single Walled Carbon Nanotubes", Mar. 25, 2007, nature nanotechnology, vol. 2 Apr. 2007, pp. 230-.

Patil et al., "Wafer-Scale Growth and Transfer of Aligned Single-Walled Carbon Nanotubes", Jul. 4, 2009, IEEE Transactions on Nanotechnology, vol. 8, No. 4, pp. 498-503.

Patil et al., "Integrated Wafer-Scale Growth and Transfer of Directional Carbon Nanotubes and Misaligned-Carbon-Nanotube-Immune Logic Structures", 2008 Symposium on VLSI Technology Digest of Technical Papers, 2008, pp. 205-206.

Lin et al., "ACCNT: A Metallic-CNT-Tolerant Design Methodology for Carbon Nanotube VLSI: Analyses and Design Guidelines", Sep. 2010, IEEE Transactions on Electron Devices, vol. 57, No. 9, pp. 2284-2295.

Lin et al., "ACCNT—A Metallic-CNT-Tolerant Design Methodology for Carbon-Nantube VLSI: Concepts and Experimental Demonstration", Dec. 2009, IEEE Transactions on Electron Devices, vol. 56, No. 12, pp. 2969-2978.

Raychowdhury et al., "Carbon-Nanotube-Based Voltage-Mode Multiple-Valued Logic Design", IEEE Transactions on Nanotechnology, Mar. 2005, vol. 4, No. 2, pp. 168-179.

Liang et al., "Design and Evaluation of Multiple Valued Logic Gates Using Psuedo N-Type Carbon Nanotube FETs", Jul. 2014, IEEE Transactions on Nanotechnology, vol. 13, No. 4, pp. 695-708.

Bachtold et al., "Logic Circuits with Carbon Nanotube Transistors", Nov. 9, 2001, Science, vol. 294, 1317-1320.

Rosenblatt et al., "High Performance Electrolyte Gated Carbon Nanotube Transistors", Jun. 2002, Nano Letters, vol. 2, No. 8, pp. 869-872.

Franklin et al., "Sub-10 nm Carbon Nanotube Transistor", Jan. 18, 2012, Nano Letters 2012, 12, pp. 758-762.

Lin et al. "CNFET-Based Design of Ternary Logic Gates and Arithmetic Circuits", Mar. 2011, IEEE Transactions on Nanotechnology, vol. 10, No. 2, Mar. 2011, pp. 217-225.

Steiner et al., "High-frequency performance of scaled carbon nanotube array field-effect transistors", Aug. 2012, Applied Physics Letters, vol. 101, pp. 053123-1-053123-4.

Krupke et al., "Separation of Metallic from Semiconducting Single-Walled Carbon Nanotubes", Jul. 2003, Science, vol. 301, pp. 344-347.

Liu et al., "Large-scale single-chirality separation of single-wall carbon nanotubes by simple gel chromatography", May 2011, Nature Communications, 2:309, pp. 1-8.

Rosenblatt et al., "Mixing at 50 GHz using a single-walled carbon nanotube transistor", Oct. 2005, Applied Physics Letters, vol. 87, pp. 153111-1-153111-3.

Shekhar et al., "Ultrahigh Density Alignment of Carbon Nanotube Arrays by Dielectrophoresis", 2011, ACSNANO, vol. 5, No. 3, pp. 1739-1746.

Wei et al. "Monolithic Three-Dimensional Interation of Carbon Nanotube FET Complementary Logic Circuits", 2013, IEEE, IEDM13-511-514.

Paul et al., "Impact of a Process Variation on Nanowire and Nanotube Device Performance", Sep. 2007, IEEE Transactions on Electron Devices, vol. 54, No. 9, pp. 2369-2376.

Javey et al., "Carbon Nanotube Field-Effect Transistors with Integrated Ohmic Contacts and High-K Gate Dielectrics", Jan. 2004, Nano Letters, vol. 4, No. 3, pp. 447-450.

Rosenblatt, "Pushing the Limits of Carbon Nanotube Transistors", Jan. 2006, Ph.D Thesis, Cornell University.

* cited by examiner

TOP

SIDE

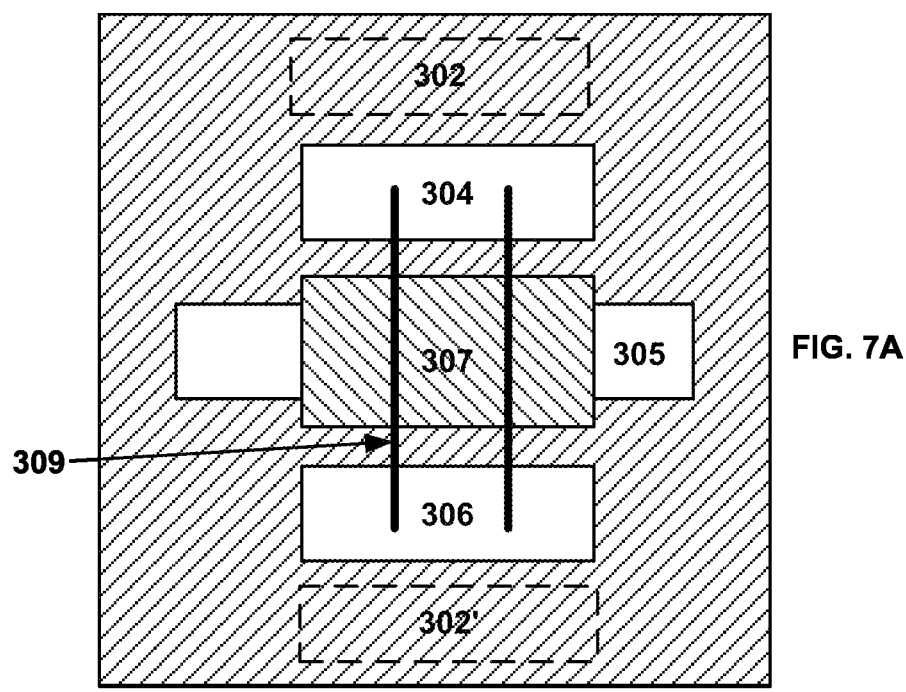
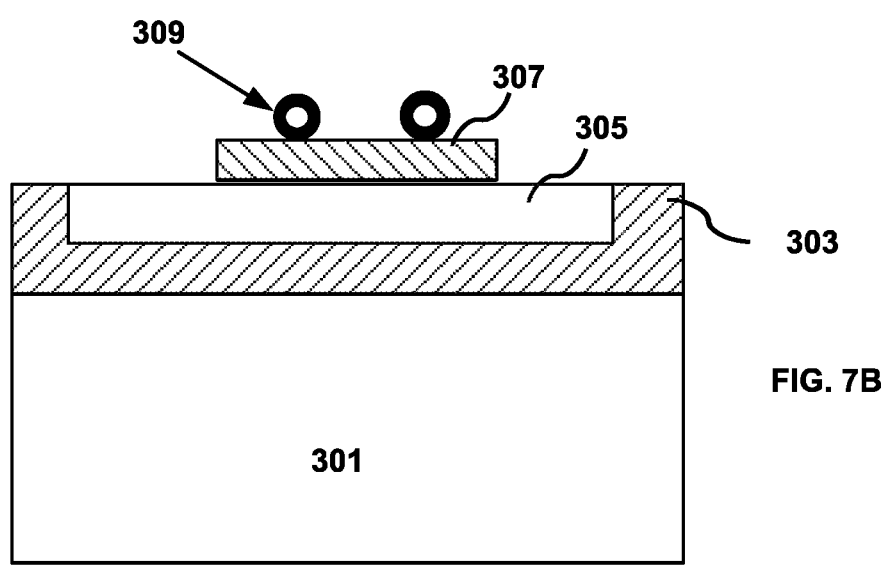

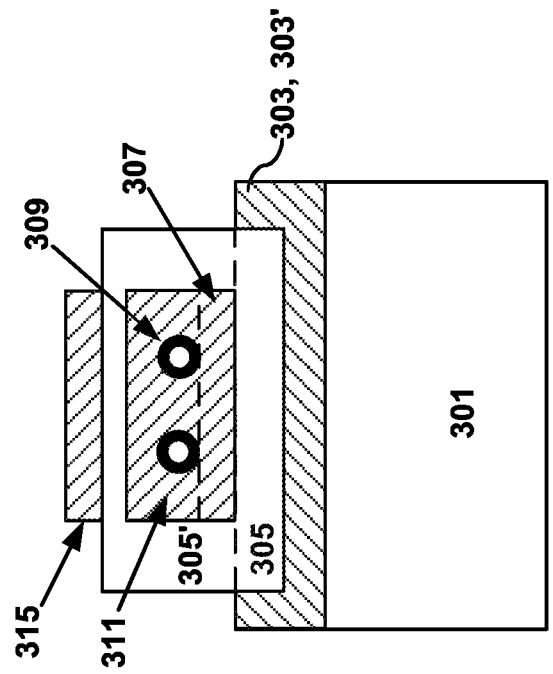
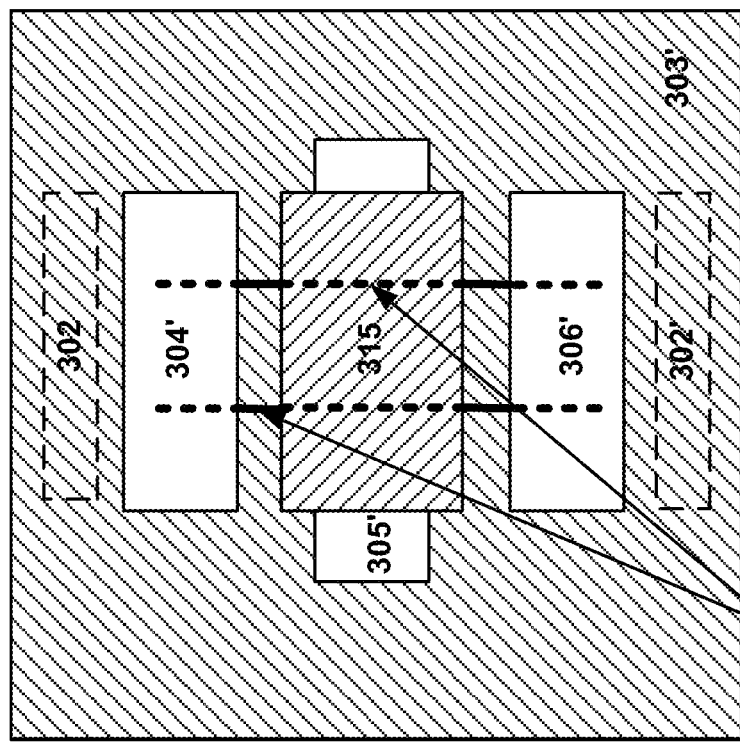

STACKED CARBON NANOTUBE MULTIPLE THRESHOLD DEVICE

BACKGROUND OF THE INVENTION

Technical Field

This disclosure relates to integrated circuit devices, and more specifically, to a multiple threshold device using carbon nanotubes and techniques for forming such devices.

Background of the Related Art

As the dimensions of modern integrated circuitry in semiconductor chips continue to shrink, scaling down traditional semiconductor devices using known techniques has become increasingly difficult. Therefore, there has been a search for new materials and techniques to replace traditional silicon. Semiconducting carbon nanotubes have been proposed as they can conduct very high currents for their size. However, because of their small dimensions, the actual current conducted is limited to tens of microamps each. Further, the difficulty in fabricating carbon nanotube arrays has prevented widespread adoption of carbon nanotubes (CNTs) as a replacement for silicon or other traditional semiconductors as active channel materials in integrated circuit devices.

Multiple threshold devices enable desired circuit applications such as ternary logic. Most traditional computer logic is based on binary logic, i.e. 1 or 0, true or false. Ternary or higher levels of multivalued logic have attracted attention due to potential advantages in simplicity and energy efficiency in chip design as the complexity of interconnections is reduced as well as speed improvements in arithmetic processing. Also Multi-threshold CMOS (MTCMOS) is a variation of CMOS chip technology which has transistors with multiple threshold voltages (Vth) to optimize delay or power.

BRIEF SUMMARY

According to this disclosure, the present invention includes an embodiment of a device structure including a gate structure containing a first layer of carbon nanotubes and a second layer of carbon nanotubes. The first and the second layers are stacked vertically. The first and the second layers have carbon nanotubes which have substantially homogeneous electric characteristics within each layer. The carbon nanotubes in the first layer have different electric characteristics than the carbon nanotubes in the second layer, so that the device structure exhibits a multiple threshold behavior when coupled to a voltage source.

Another embodiment of the invention included a method for fabricating a multithreshold device structure. A conductive gate structure is formed upon which a first dielectric layer is formed. Next, a first layer of carbon nanotubes having a first set of substantially homogeneous electric characteristics is formed on the first dielectric layer. A second dielectric layer is formed over the first dielectric layer and the first layer of carbon nanotubes. A second layer of carbon nanotubes having a second set of substantially homogeneous electric characteristics is formed on the second dielectric layer, wherein the second set of homogeneous electrical characteristics differ from the first set of characteristics. A third dielectric layer is formed over the second dielectric layer and the second layer of carbon nanotubes. A top layer of conductive gate material is formed over the third dielectric layer. The layers form a vertically stacked gate structure.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawn to scale, and in which:

FIGS. 7A and 7B are top and cross-sectional diagrams of a structure in a subsequent point in the process for building the structure according to an embodiment of the invention;

FIGS. 10A and 10B are top and cross-sectional diagrams of a structure in a subsequent point in the process for building the structure according to an embodiment of the invention.

DETAILED DESCRIPTION OF THE DRAWINGS

Figure 1B:
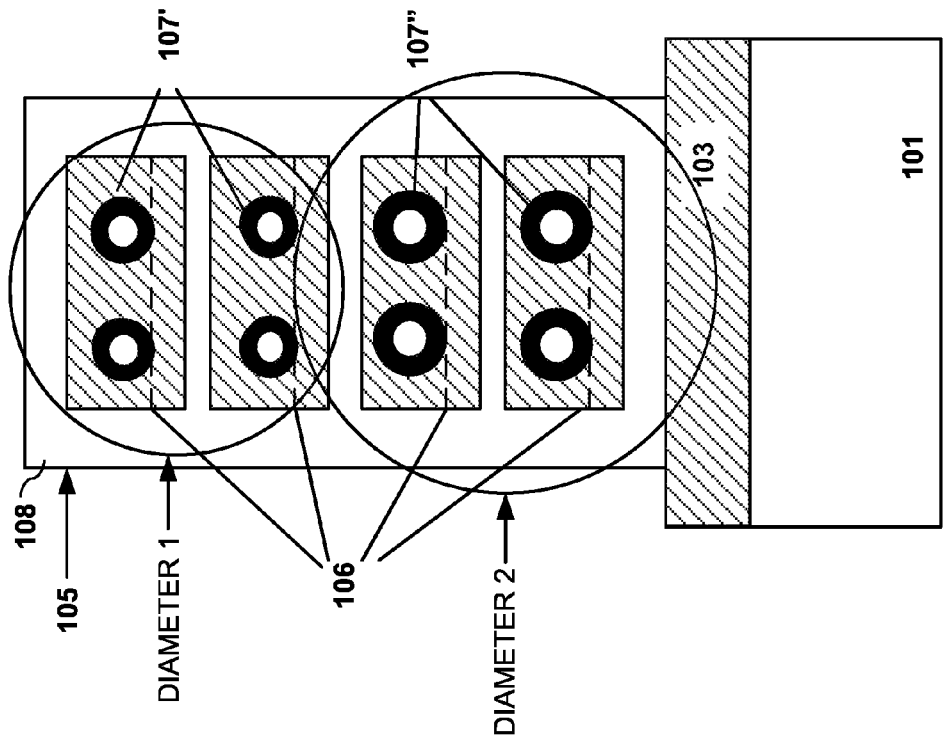
FIGS. 1A and 1B are top and cross-sectional diagrams of a structure according to an embodiment of the invention.

At a high level, the present invention concerns a stacked carbon nanotube (CNT) structure comprising a plurality of levels of nanotubes, wherein at least two of the levels includes nanotubes of different dimensions, in a multithreshold device. The present invention also include the methods for fabricating such a device. More particularly, the present invention concerns a multiple-threshold carbon nanotube stacked device engineered to include multiple layers of carbon nanotubes having distinct properties, wherein each layer of carbon nanotube material includes a narrow band of nanotube diameters, and consequently, of carbon nanotube electrical properties. Embodiments of the invention use distinct, substantially homogeneous properties for different layers of the stack. Embodiments of the invention use alignment between the carbon nanotubes so the carbon nanotubes in a respective layer do not intersect each other. Additionally, the CNTs bridge source to drain with high probability in preferred embodiments of the invention. In preferred embodiments of the invention, each layer of the device comprises a highly homogeneous carbon nanotube material. The multilevel structure of embodiments of the invention includes a gate metal sandwich for optimal electrical characteristics such as gate voltage control and threshold voltages.

While multiple threshold devices exist in traditional CMOS, thermal and doping controls are challenging.

The embodiments discussed below relate to carbon nanotubes such as might be used in device structures, particularly multiple threshold devices, as well as to methods for making such carbon nanotube structures in semiconductor devices.

A "substrate" as used herein can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures, etc.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc. In the case of a semiconductor CNT, there is no impurity as CNTs do not use the channel inversion phenomenon used in regular semiconductors.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide that have relative dielectric constants above that of SiO2 (above 3.9). The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern. A liftoff process can be used wherein a material is deposited over the patterned resist layer and the unprotected portions of a substrate. The resist is removed to leave the deposited pattern of material on the substrate.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall structures. The sidewall structures can be used as masking structures for further semiconducting processing steps.

To the inventors' knowledge, this is the first stacked CNT device structure having multiple layers, each layer having CNTs with distinct properties and a processing technique to form the same. Stacking allows the invention to ensure each layer is optimized for one aspect such as a fixed diameter. This is important in a multithreshold device to ensure that the electrical properties of each level of CNTs combine to form a device with multiple, distinguishable threshold voltages. One of the disadvantages of a multithreshold device as opposed to binary device is that the threshold voltages which correspond to each of the logic values are more critical to control.

The same structure can also be used to bring together nanotubes optimized for different functionality, such as sensors and optical detectors co-integrated with electrical processing devices.

Ternary logic functions are defined as those functions having significance if a third value is introduced to the binary logic. For example, 0, 1, and 2, or −1, 0, and +1, denote the ternary values to represent false, undefined, and true, respectively. Higher level logic, i.e. quaternary, will have more values able to be expressed in the logic. This is compared to the more commonly known bivalent logics (such as classical sentential or Boolean logic) which provide only for 0 and 1, or true and false. The basic ideas of ternary logic were initially created by Jan Łukasiewicz and C. I. Lewis and modified by Grigore Moisil in an axiomatic algebraic form, and also extended to n-valued logics in 1945. As compared to Boolean Logic which has four operators, the addition of a third value in ternary logic leads to a total of twenty seven distinct operators on a single input value. In circuit design, since each wire can transmit more information, the number of connections can be reduced. Furthermore, since each device can process more information than a binary device, the circuit complexity should be reduced. With fewer devices on the chip, the connections to other parts of a computer, i.e. connections on or off the chip can be reduced, alleviating the difficulty in making the pin out connections by reducing their number.

Figure 1A:
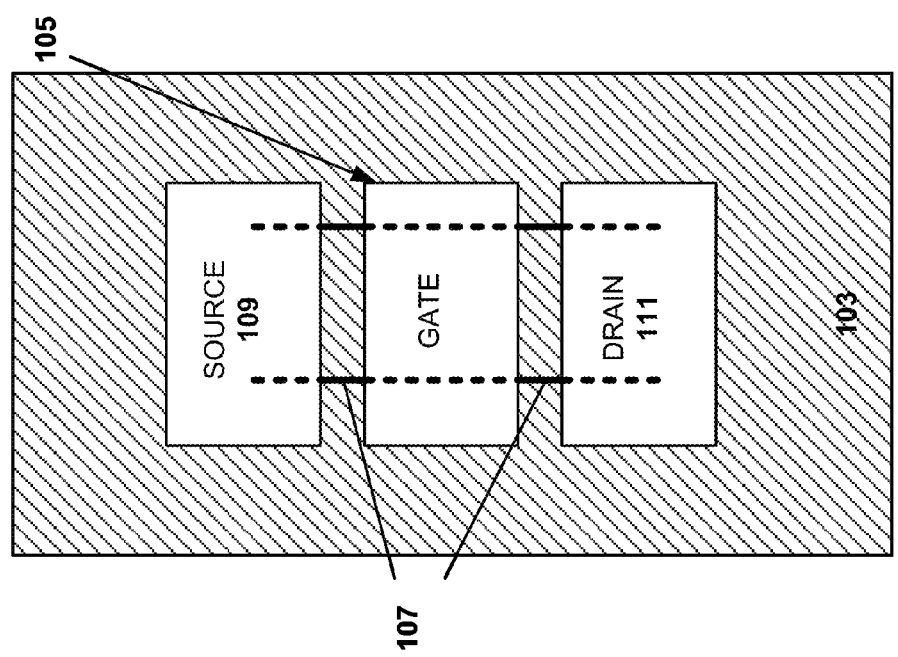

FIGS. 1A and 1B are respectively top and cross-sectional diagrams of a structure according to an embodiment of the invention. FIG. 1B is a cross-sectional diagram across the gate structure of FIG. 1A. As shown in the figures, the device is created upon a substrate comprising a semiconductor layer 101, e.g., silicon, and an insulator layer 103, e.g., silicon dioxide. The gate 105 which is comprised of a set of layers of insulator 106, e.g., hafnium oxide (HfO2), carbon nanotubes 107 and a conductive layer 108, e.g., metal, is disposed between source 109 and drain 111. As shown in FIG. 1A, the carbon nanotubes 107 electrically interconnect the gate 105 with the source 109 and the drain 111 regions. Each layer of carbon nanotubes is incased in a high K dielectric material such as hafnium oxide (HfO2). As shown in FIG. 1B, the carbon nanotubes in different layers have different diameters and therefore different electrical properties. As shown, the top two layers of the gate structure 105 have carbon nanotubes 107' of diameter 1, for example 1.4 nm, and the bottom two layers of the gate 105 have carbon nanotubes 107 of diameter 2, for example 0.5 nm. Although in the figure, two nanotubes are shown in each layer for ease in illustration, in embodiments of the invention, one nanotube or greater numbers of nanotubes are present in each layer of the invention. Greater numbers of nanotubes in a respective layer will increase the current carrying capacity of the device.

Diameter control is the simplest way to create a multiple-level logic device using carbon nanotubes. With unipolar CNTs, different diameter CNTs will have different electrical properties, all other factors being equal. In general, the band gap for a CNT is inversely proportional to the diameter. Different diameter CNTs can be separated into homogeneous groups or collections by the processes described below. However, in other embodiments of the invention, a plurality of electrically homogeneous collections of carbon nanotubes, where each respective collection has carbon nanotubes of substantially similar electrical properties can be obtained through other means. The differing electrical characteristics are achieved by other methods such as doping the carbon nanotubes. So long as electrically homogeneous collections of nanotubes are provided during the fabrication steps for each respective layer, different techniques for obtaining such nanotubes are within the purview of the invention. By integrating tightly controlled CNT collections, into successive layers of a CNT stack with the geometry proposed by the invention, threshold voltage variation can be minimized. As shown, in some embodiments of the invention, multiple layers of CNTs having the same electrical properties, e.g., the same CNT diameter can be used within the stack for desired threshold voltages. By using the same type of nanotube in multiple layers, redundancy for a given threshold voltage as well as an increased current carrying capability are achieved.

In preferred embodiments of the invention, single wall carbon nanotubes (SWCNTs) are used. SWCNTs are particularly interesting for application in electronic devices because of their electrical characteristics, e.g., high electrical conduction, but are frustrating because current methods of synthesizing them create a heterogeneous tangle of SWCNTs with a variety of diameters, bandgaps and electronic types. Double wall carbon nanotubes (DWCNTs) and multi-wall carbon nanotubes (MWCNTs) have less uniform electrical properties, and so are less useful in the invention. Consequently, there have been intense efforts to develop various methods for separating SWCNTs, including selective chemistry, dielectrophoresis, selective oxidation, ultracentrifugation and DNA wrapping chromatography. Methods have been developed to separate the CNTs using structure-discriminating surfactants and ultracentrifugation. Bile salts and their mixtures have been found to be effective. For instance, by using mixtures of two surfactants that competitively adsorb to the SWCNT surface, optimal metal CNT to semiconductor CNT separation is achieved. By combining these techniques, e.g., repeated centrifuge operations and competing surfactants, quantities of SWCNTs can be obtained that are greater than 97% pure within a small range of carbon nanotube diameters. Another method of large-scale separation of SWCNTs uses a single-surfactant multicolumn gel chromatography method utilizing one surfactant and a series of vertically connected gel columns. This method is based on the structure-dependent interaction strength of SWCNTs with an allyl dextran-based gel. The adsorption sites in the gel are bound to the CNTs which have the strongest interaction with the gel, allowing the other CNTs to flow by. Once all the adsorption sites are occupied by the strongest interacting CNTs, the next set of sites is occupied by the next most strongly interacting CNTs, and so on. This process allows different species of CNTs to be separated along the gel column. Using this method, metallic SWCNTs can be collected in an unbound state since they had the least interaction with the gel. If semiconductor CNTs are desired, the CNTs captured in one gel column repeated undergo the same process with a diluted surfactant solution until the desired species of CNTs is obtained.

Figure 2A:
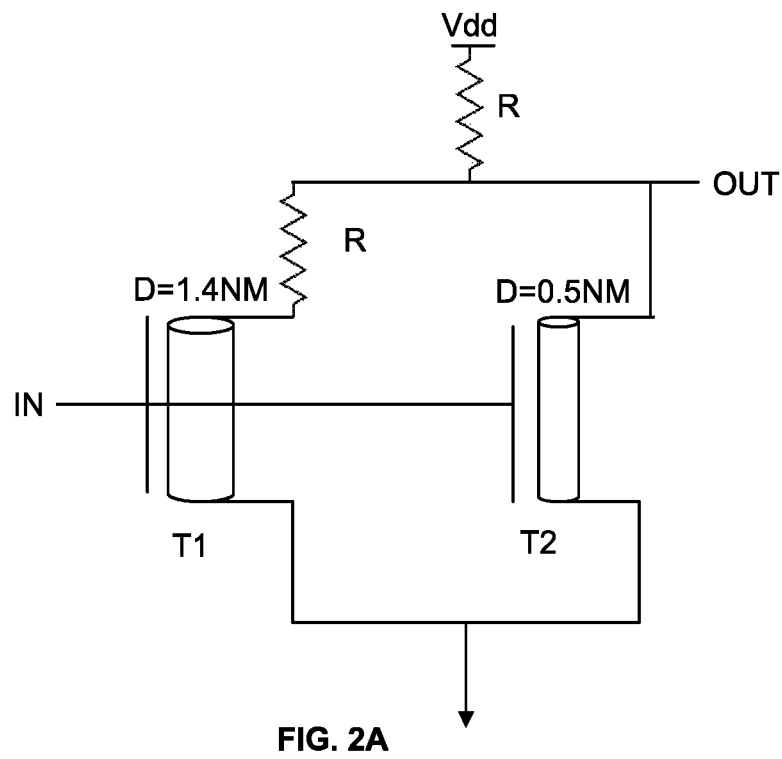
FIG. 2A is a simplified schematic circuit diagram of a structure using carbon nanotubes.

FIG. 2A is a simplified schematic circuit diagram of a structure built using carbon nanotubes. As shown, a carbon nanotube with a diameter of 1.4 nm is shown coupled in parallel with a carbon nanotube with a diameter of 0.5 nm. The carbon nanotubes function as a channel between source and drain. In an actual device, multiple CNTs of both diameters would be present in the device structure. This embodiment portrays the use of two different diameters of nanotubes, e.g., to make a ternary device. For quaternary (and above) devices, three (or more) different diameters would be coupled in the gate area. The number of voltage states would equal the number of different types of CNTs plus one for the state where they are all turned off.

Figure 2B:
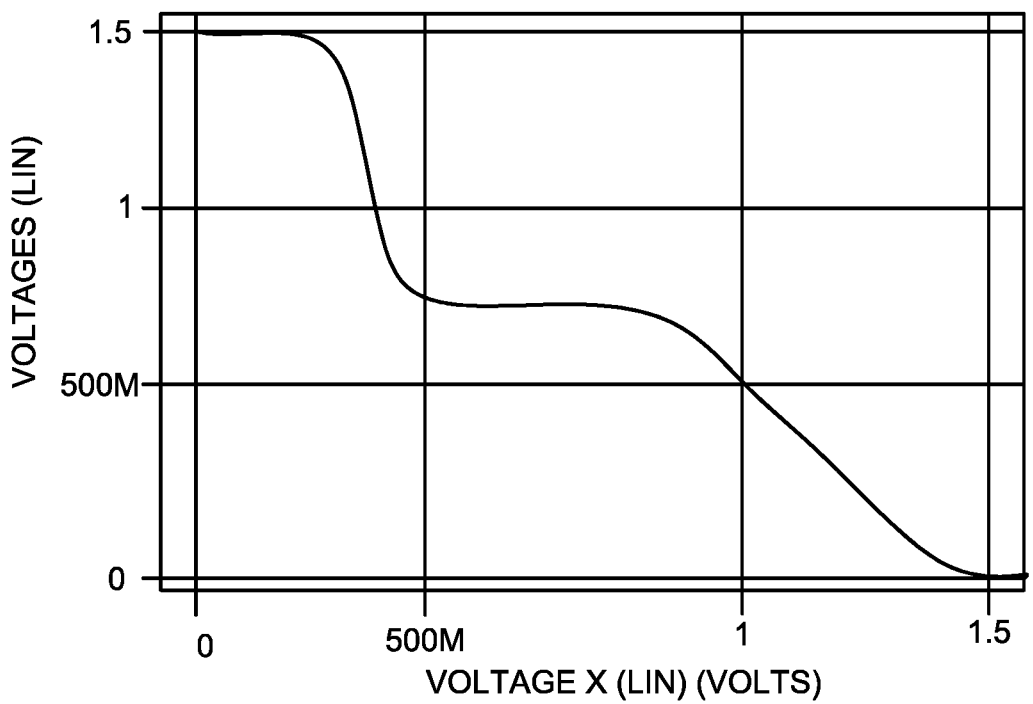
FIG. 2B is a voltage transfer characteristic diagram of a structure built using carbon nanotubes to produce a multithreshold voltage.

FIG. 2B is a simplified transfer voltage characteristic diagram of a nanotube device structure built to produce a multithreshold voltage. In the figure, three threshold voltages, one at 0.25V, 0.35V, and zero V, are depicted. To obtain good plateaus at the threshold voltages, tight control of the diameters of the nanotubes used to fabricate the device is desirable. The multilevel structure of the present invention greatly facilitates ensuring that proportionate numbers of different sized nanotubes are incorporated into each device, as compared to building a device of different sized nanotubes using a planar structure. In a preferred embodiment, the total resistance of each layer is controlled by using a similar number of CNTs in each layer of the device. Preferably, the resistance of each CNT in the on state is on the order of 6.5 kOhms and independent of diameter for short runs/gate lengths, which is satisfied for sub-10 nm technologies. With a sufficient number of CNTs per layer, the total resistance can be in the 100-1 k Ohm range per CNT diameter, comparable but smaller than load R. In the example in the drawing, since 1.4 nm has a small band gap, it turns on first, and the voltage output gets divided by a factor of 2 or less. When T2 turns on, the output will be close to ground as long as R>>resistance (T2).

Figure 3A:
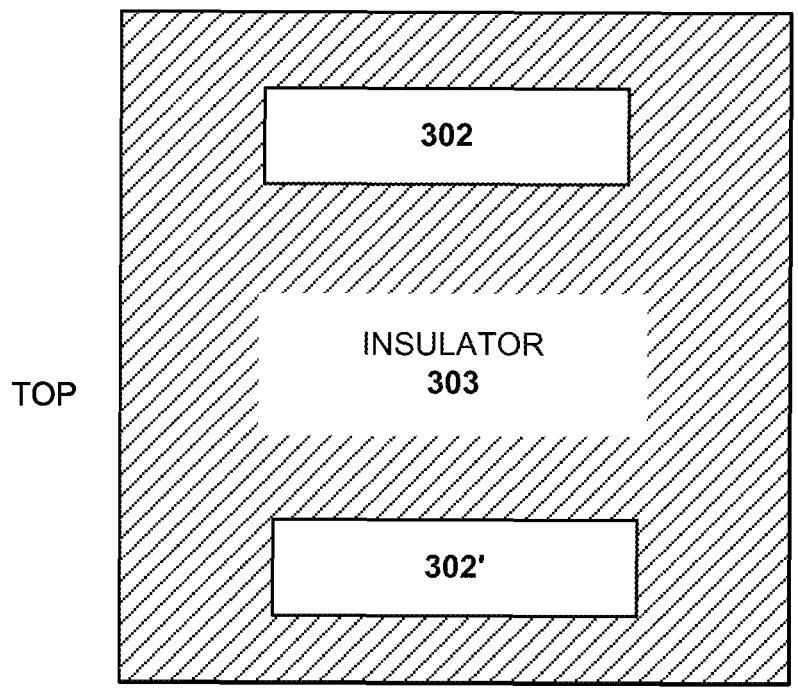
FIGS. 3A and 3B are top and cross-sectional diagrams of a structure in one point in the process for building the structure according to an embodiment of the invention.
Figure 3B:
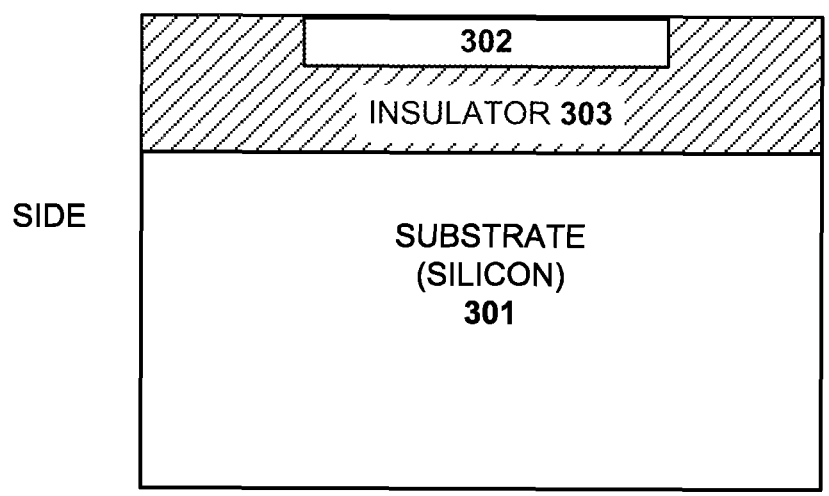

FIGS. 3A and 3B are top and cross-sectional diagrams of a structure in a first point in the process for building the structure according to an embodiment of the invention in which a substrate 301, e.g., silicon is covered with an insulator 303, e.g., silicon dioxide. FIG. 3B is a cross-sectional diagram across the one of the optional contacts 302 of the structure of FIG. 3A. Other suitable substrates include, but are not limited to SOI and quartz substrates. The insulator could be composed of alternative materials such as Hf02 or dielectric materials. As shown in the figure, trenches have been patterned and etched in the insulator layer 303 for optional contacts 302, 302'. These optional contacts 302,302' may be used in subsequent steps to align the CNTs from source to drain. Suitable processes to accomplish this etching step would be a reactive ion etch (RIE) followed by a wet etch through a patterned photoresist layer. After stripping the photoresist layer, the trenches are filled with a metal, or combination of metals, deposited by, for example, electronic beam evaporation or chemical vapor deposition.

Although these diagrams and the ones following show the optional buried electrodes 302, 302' on either side of a single device, to save chip area, the optional buried electrodes can be placed on either side of multiple devices. As described below, the optional buried electrodes may be used to align the CNTs between source and drain in one embodiment of this invention. In the embodiments where the optional buried electrodes are shared, long CNTs will span multiple devices and then the excess lengths between devices can be masked and etched away, thereby creating shorter lengths which are positioned correctly on each device. The buried electrodes are optional as other methods such as functionalization, to be discussed below, exist in other embodiments of the invention for aligning the CNTs. The terms optional buried electrodes 302 and 302', optional contacts 302 and 302', and contacts 302 and 302', contacts 302 and 302', buried electrodes 302 and 302', buried anode and cathode electrodes 302 and 302', bottom electrodes 302 and 302', are used interchangeably in the remaining of this discussion.

Figure 4A:
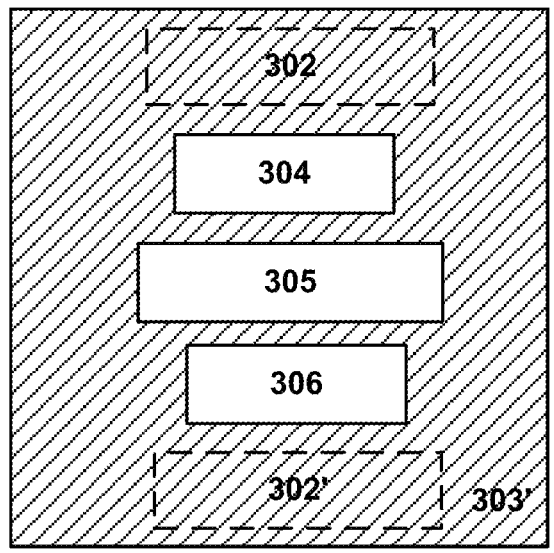
FIGS. 4A-4C are top and cross-sectional diagrams of a structure in a subsequent point in the process for building the structure according to an embodiment of the invention.
Figure 4B:
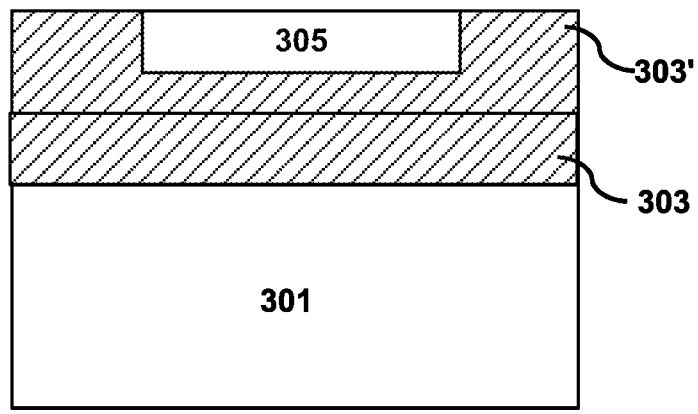
Figure 4C:
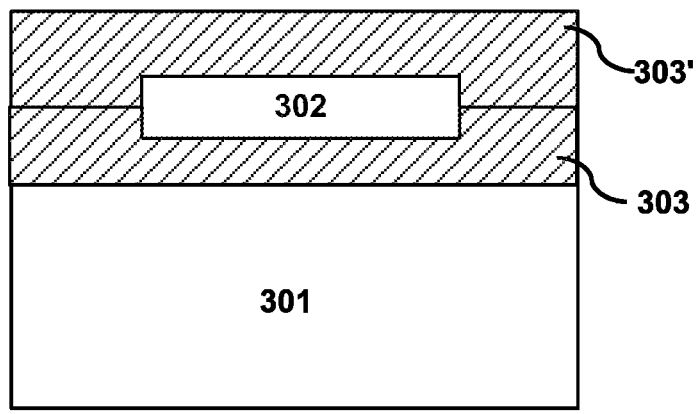

FIGS. 4A and 4B are top and cross-sectional diagrams of a structure in a subsequent step of the process for building the structure according to an embodiment of the invention. FIG. 4B is a cross-sectional diagram across the gate structure 305 of FIG. 4A. FIG. 4C is a cross-sectional diagram across contact 302. As shown in FIG. 4C, a second insulator layer 303' has been deposited, burying the contacts 302, 302'. Trenches have been patterned and etched in the insulator layer 303' in one embodiment of the multithreshold device for the source 304, gate 305 and drain 306. In transistors, current flows between two terminals, called 'source' and 'drain'. This current is controlled by the voltage at a third terminal, the 'gate'. Suitable processes to accomplish this step would be a reactive ion etch (RIE) followed by a wet etch through a patterned photoresist layer. After stripping the photoresist layer, the trenches are filled with a metal, or combination of metals, deposited by, for example, electronic beam evaporation or chemical vapor deposition. Alternatively, a liftoff process can be used to pattern the source, drain and gate. Further, a separate process can be used for the source/drain and the gate, so that a different conductive material can be used for the gate material.

The particular metals used in the source 304, drain 306 and gate may be selected to tune the threshold voltages of the device. Suitable metals for the gate material include aluminum or palladium, but other metals or materials such as doped polysilicon could be used. Source and drain metals can be used to tune the polarity of the CNT due to well-known intrinsic Schottky barriers from chemical mismatch. Alkali metals (hard to encapsulate, but nonetheless used) such as Li, Na, Ca, can be used to turn the CNT from pFET to nFET. Pd is a preferred material for pFET contacts. Au over Cr or Ti are alternatives.

Figure 5A:
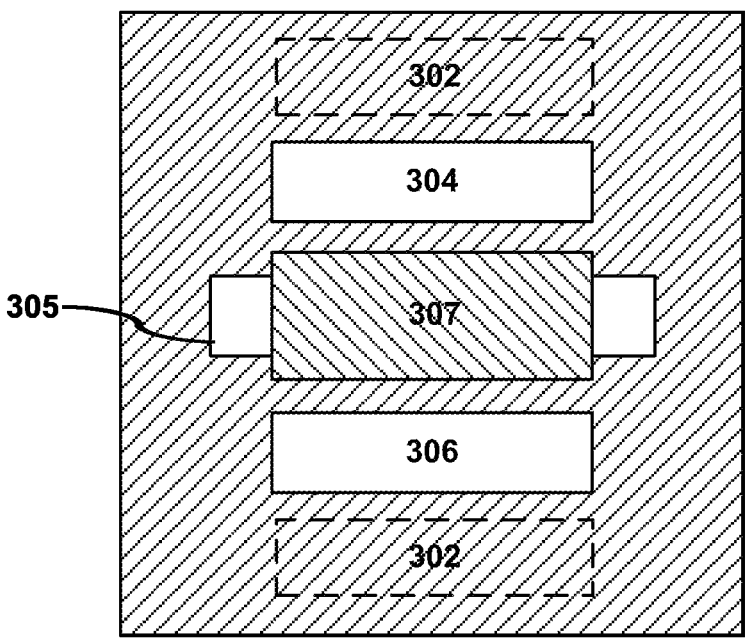
FIGS. 5A and 5B are top and cross-sectional diagrams of a structure in a subsequent point in the process for building the structure according to an embodiment of the invention.
Figure 5B:
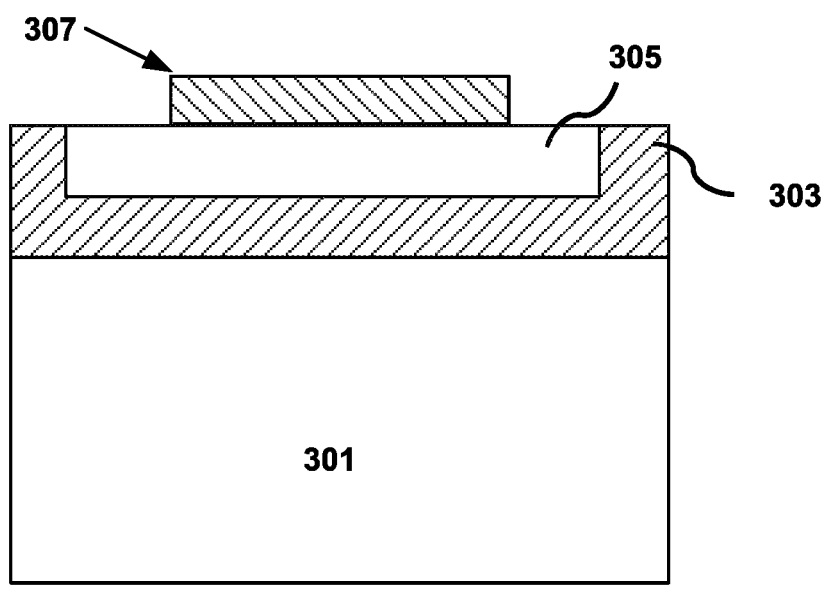

FIGS. 5A and 5B are top and cross-sectional diagrams of a structure in a subsequent point in the process for building the structure according to an embodiment of the invention. FIG. 5B is a cross-sectional diagram across the gate structure of FIG. 5A. An insulator layer 307 which will serve as a gate dielectric of the device is patterned over the metal in the gate area. The insulator patterning can be accomplished either by an etch step wherein the desired insulation is protected by a photoresist mask or a lift-off process. For a transistor to switch efficiently, the gate needs to be isolated from source and drain by a thin piece of insulating dielectric. In some preferred embodiments, a high k dielectric, such as hafnium oxide ($HfO_2$), is used. Other high k dielectrics include, zirconium oxide, titanium and hafnium nitrides, tungsten, ruthenium and ruthenium oxide and certain metal silicides. A chemical vapor deposition process (CVD) or an atomic layer deposition (ALD) can be used to deposit the gate dielectric material.

As will be described below, in preferred embodiments, each layer of the gate structure includes a first dielectric layer, a layer of carbon nanotubes, a second dielectric layer and a conductive layer forming a top gate layer.

Figure 6A:
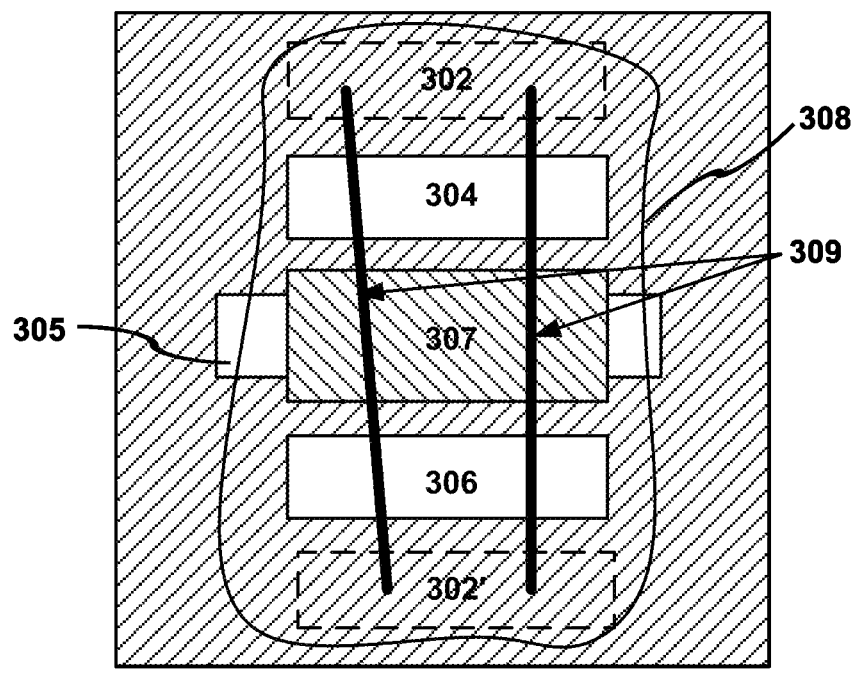
FIGS. 6A and 6B are top and cross-sectional diagrams of a structure in a subsequent point in the process for building the structure according to an embodiment of the invention.
Figure 6B:
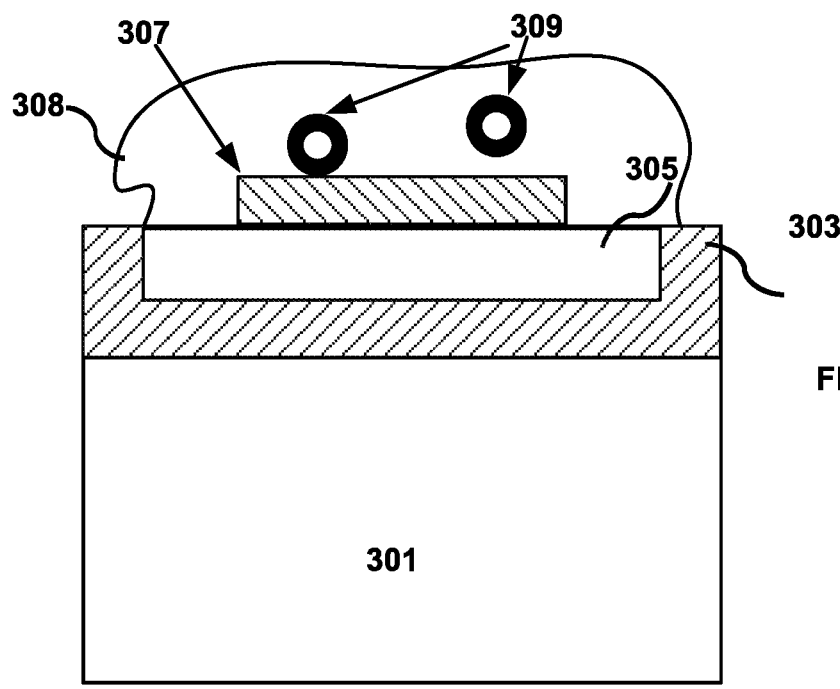

FIGS. 6A and 6B are top and cross-sectional diagrams of a structure in a subsequent step of the process for building the structure according to an embodiment of the invention. FIG. 6B is a cross-sectional diagram across the gate structure of FIG. 6A. These figures depict the deposition of carbon nanotubes from source 304 to drain 306 over the gate dielectric 307. In one embodiment, an AC dielectrophoresis (DEP) process is used to align the CNTs. Dielectrophoresis is a process in which a force is exerted on a dielectric particle, in this case, the suspended CNT, when it is subjected to a non-uniform electric field to move in the direction imparted by the force. Gradually, when subjected to the AC field, the induced dipole moment causes the carbon nanotubes to align in parallel from source to drain. The buried contacts 302, 302' are used to create the AC field. The DEP method can provide CNT placement with reasonable density. An aqueous solution 308 suspends carbon nanotubes 309 over the source 304, gate 305 and drain 306 electrodes while an alternating voltage is applied between the buried anode and cathode electrodes 302, 302'. In one preferred embodiment of the invention, a diluted CNT suspension (0.5 μg/ml) is used while an alternating voltage ($V_{pp}$=4 V and f=300 kHz) is applied for 10 minutes. Other process conditions can be used in other embodiments of the invention. After applying the AC for a predetermined period, the CNTs are aligned in a parallel array between source and drain. The CNT solution is removed by de-ionized water and then dried by a stream of nitrogen or other means. Unwanted portions of CNTs which have not already been removed by the de-ionized water wash can be etched away. Also, CNT length which extends beyond the source and drain can be removed by an etch process. In embodiments using shared electrodes and the CNTs span multiple devices, the CNT lengths between devices can be removed by the etch process.

Other methods besides DEP can be used to align the CNTs in preferred embodiments of the invention. Solutions with pure solutions of CNTs, e.g., greater than 99% semiconducting CNTs, can be used to deposit aligned CNTs on a substrate. A preferred deposition method uses some "functionalization" of the oxide in the target CNT locations on or near the device so that the CNTs land on those locations directed by chemistry rather than by AC dielectrophoresis. In some embodiments, the CNTs have added functionalization as well. "Functionalization" refers to the technique of attaching chemical features on surfaces of materials by chemical synthesis methods. The surfaces of CNTs or of target locations may be functionalized in order to direct assembly. Chemistry using phenyl groups can be used to form covalent bonds between the surface and the CNTs. Other covalent and noncovalent binding chemistries could be used. Surfaces can be patterned with DNA-compatible groups such as, but not limited to, gold nanoparticles. That way, DNA-wrapped CNTs would be trapped at those locations. Defects in the surface and the CNTs can be induced by partial etching and provide orientational control of the CNTs once functional groups are attached to the defect sites. By patterning the wafer with the right pattern density, roughly one carbon nanotube per functionalized location on wafer would be deposited and aligned.

The resulting structure is shown in FIGS. 7A and 7B which are top and cross-sectional diagrams of the structure. FIG. 7B is a cross-sectional diagram across the gate structure of FIG. 7A. As shown in the drawing, the CNTs 309 are aligned in parallel and connect source to drain. Although only two CNTs are shown for ease in illustration, a greater number of CNTs is preferred in some embodiments, depending upon the desired device characteristics. The properties of parallel alignment, i.e. the CNTs in a layer and do not cross one another, and source to drain connection should be maintained to control the electrical properties of the device. Intersecting CNTs can change the threshold voltages depending on the nature of the crossover of the CNTs. The current carrying capability of the device is increased the greater number of CNTs per layer. Using the multiple layers, the present invention improves the current carrying capability of the device.

Figure 8A:
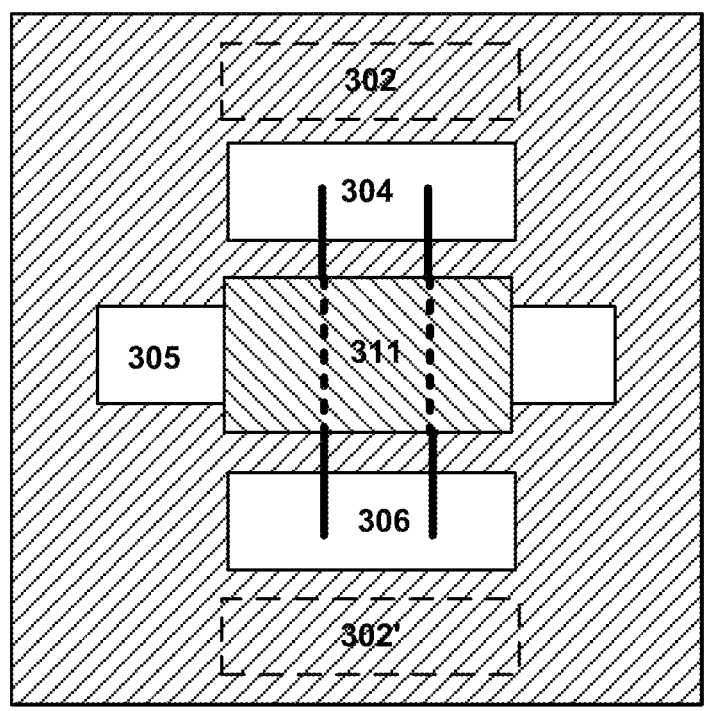
FIGS. 8A and 8B are top and cross-sectional diagrams of a structure in a subsequent point in the process for building the structure according to an embodiment of the invention.
Figure 8B:
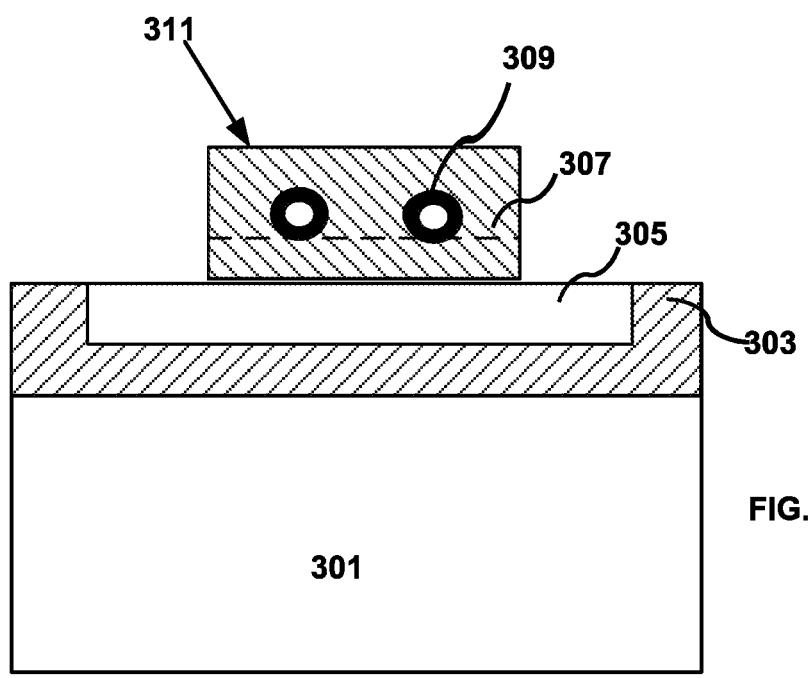

FIGS. 8A and 8B are top and cross-sectional diagrams of a structure in a subsequent point in the process for building the structure according to an embodiment of the invention. FIG. 8B is a cross-sectional diagram across the gate structure of FIG. 8A. These drawings illustrate the patterning and deposition of a top gate dielectric layer 311 having been deposited over the nanotubes 309 in the gate region 305. In a preferred embodiment of the invention, the dielectric 311 is of the same composition and is deposited in the same manner as for the gate dielectric 307 described with respect to FIGS. 5A and 5B. In the preferred embodiment, high k dielectrics are used. Dual-side high-k gate dielectrics in close proximity of the CNTs maximizes gate efficiency of the device. After the first layer of CNTs are deposited, a lift-off process is preferred to pattern the oxide and metal layers to avoid damage to the CNTs which might be caused by an etch process such as a damascene process.

Figure 9A:
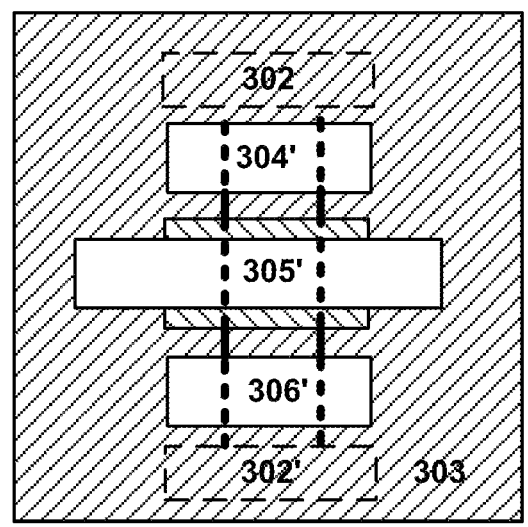
FIGS. 9A-9C are top and cross-sectional diagrams of a structure in a subsequent point in the process for building the structure according to an embodiment of the invention.
Figure 9B:
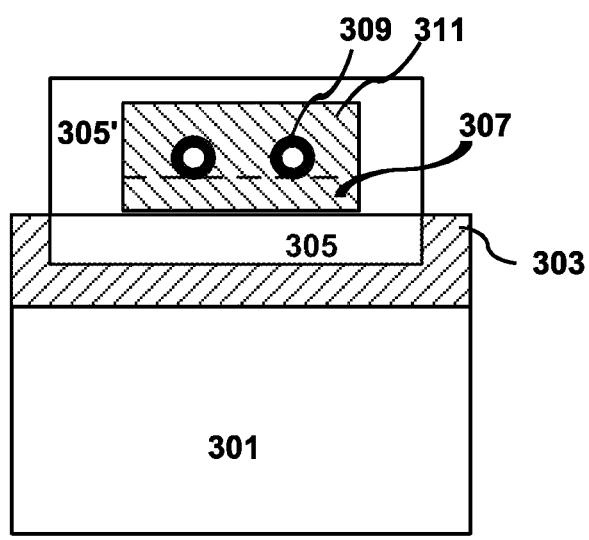
Figure 9C:
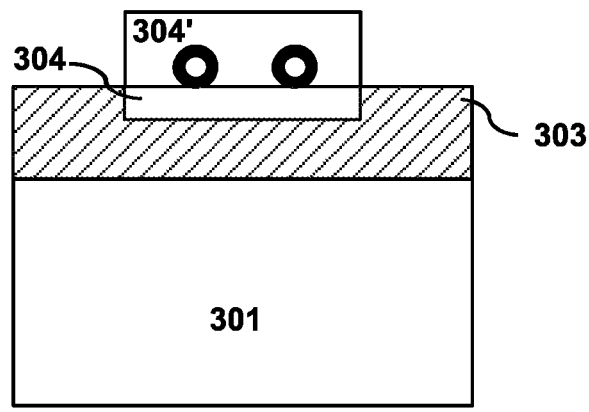

FIGS. 9A, 9B and 9C are top and cross-sectional diagrams of a structure in a subsequent point in the process for building the structure according to an embodiment of the invention. FIG. 9B is a cross-sectional diagram across the gate structure of FIG. 9A. FIG. 9C is a cross-sectional diagram across the source structure of FIG. 9A. The diagrams show a top gate material 305' being deposited over the dielectric layer 311 and a top source material 304' and a top drain material 306' being respectively deposited respectively on source material 304 and drain material 306. In a preferred embodiment, the top gate material 305' is similar to the bottom gate material 305, and the top source material 304' and a top drain material 306' similar to source material 304 and drain material 306. That is, depending on the device characteristics chosen, a metal, or combination of metals, or a material such as doped polysilicon could be used. Whichever gate material is chosen, the gate material is deposited and patterned to cover the footprint of the gate area. Each of the source, drain and gate materials may be deposited in different lift-off steps as each of the materials could be different or have different thicknesses in different embodiments of the invention. For example, source material 304' and drain material 306' could be thicker than gate material 305' to make up for the difference in height caused by gate electric 307, 311. At this stage in the process, the first level of the gate structure is finished.

As shown in FIGS. 10A and 10B, the process continues to build more layers in the gate structure and source and drain structures. These drawings show top and cross-sectional diagrams of the structure after the subsequent step of the high-k dielectric patterning of the next gate dielectric layer 315.

Although not depicted, the process continues for each layer until the desired number of layers in the gate structure is built. For each layer, the CNTs deposited have a chosen diameter and/or chemical dopant to have the desired band gap and voltage threshold characteristics for that layer. The top gate dielectric and top gate material are patterned and deposited as described above for each layer. In general, the more levels of CNTs, the greater the current carrying capabilities of the device.

Figure 11C:
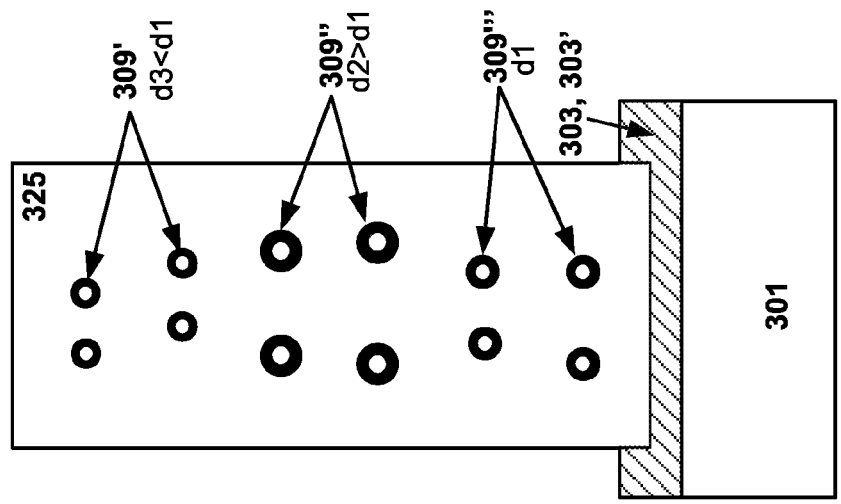
FIGS. 11A and 11B and 11C are top and cross-sectional diagrams of a structure in a subsequent point in the process for building the structure according to an embodiment of the invention.
Figure 11B:
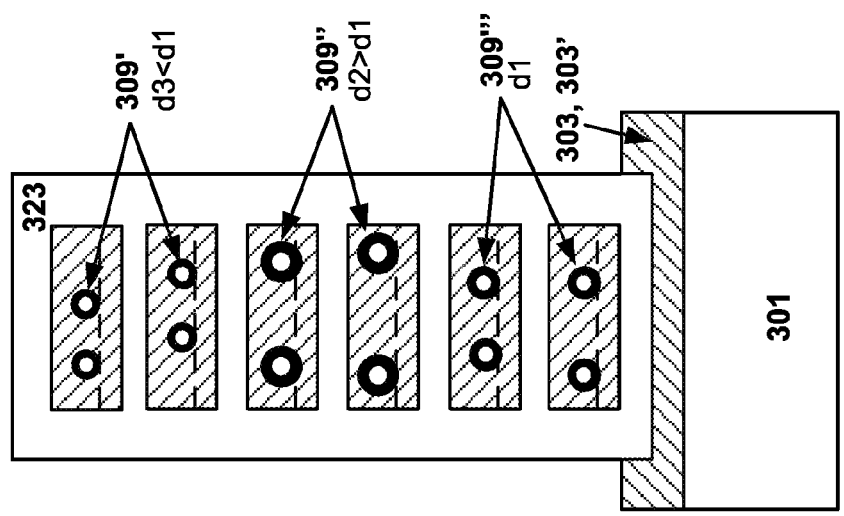
Figure 11A:
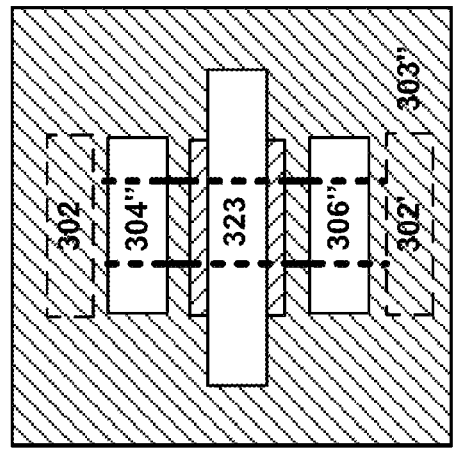

FIGS. 11A and 11B are top and cross-sectional diagrams of a completed structure according to an embodiment of the invention. FIG. 11B is a cross-sectional diagram across the gate structure of FIG. 11A. FIG. 11C is a cross-sectional diagram across the source structure of FIG. 11A. As shown, a six-layer high CNT stack 323 in the gate area is shown. The drawing depicts a quaternary device as three different diameters of CNTs, 309', 309" and 309''' are included in the device. Each diameter of CNT will have different electrical characteristics. By including multiple layers of CNT with the same diameter, the current carrying capability for that type of CNT is increased while preserving chip footprint as compared to a planar device. Multiple layers can compensate for low CNT placement at a particular layer. The vertical structure is compatible with the finFET topology used in many of today's integrated circuits. The multiple layers of conductive gate material form a wrap around conductive gate structure 323 which provides a common gate electrode connection for the stack. In one preferred embodiment, carbon nanotubes are separated from each other by at least the diameter of a carbon nanotube. The source and drain electrodes are built in a similar fashion so that a multilevel source electrode which is electrically coupled to a first end of each carbon nanotube and a multilevel drain electrode which is connected to a second end of each carbon nanotube are formed. As shown in FIG. 11C, a multilevel source electrode 325 encases the carbon nanotubes 309', 309", 309'''. The drain electrode (not shown in cross-section) is similar to the source electrode.

In those embodiments using alignment electrodes, embedding bottom electrodes 302, 302' is optional as the electrodes can be built directly on the substrate layer at the same level as the source and drain. However, embedded electrodes are preferred to avoid heating the CNTs by direct contact with the powered electrodes during the dielectrophoresis process. Also, as the gate structure gets higher, higher levels of the electrodes can be built, much like the stacked gate, stack source and stacked drain structures, to ensure that the AC field is sufficient to align the CNTs at higher levels of the device. The higher levels of electrodes can be built both in the embodiments where the electrodes are for a single device or for the embodiments where the electrodes are shared between devices.

By sandwiching the CNTs from two sides the wrap-around gate material provides for optimal FET performance, higher geometrical capacitance, greater gate control, steeper and faster on-off transition.

Although the gate structure depicted in FIG. 11B is viewed as preferred by the inventors, in alternative embodiments of the invention, the gate structure can be simplified by eliminating the intervening conductive gate material layers and one of the dielectric layers in each layer of the gate structure. In this simplified gate structure, a single dielectric layer would be disposed between carbon nanotubes.

Given that each CNT ideally can have a resistance of 6.5 kOhms, which is comparable to a CMOS range of 100-500 uA at 1V, a total of 8-15 CNTs for the entire stack of the device will suffice for many embodiments of the invention. This could be achieved by having 4 layers with a yield slightly over 2 CNTs per application (2-3 CNTs per layer), or two layers with 5 CNTs each. Fewer process steps are used with fewer layers, however, two layer designs are less competitive if high pattern density is desired.

As would be understood by those ordinarily skilled in the art, the foregoing structures can be formed simultaneously with other structures on the same substrate. For example, a plurality of similar logic devices using CNTs, but having differing number of levels can be built. Metallic CNTs can be used as resistors in a similar fashion, or as resistive metal wiring. The same structure can also be used to bring together nanotubes optimized for different functionality, such as sensors and optical detectors co-integrated with electrical processing devices In embodiments of the invention, a multiple-threshold carbon nanotube stacked device is designed to include multiple layers of distinct carbon nanotubes, where each distinct layer of carbon nanotube material includes a narrow band of nanotube diameters, and consequently, of carbon nanotube electrical properties. By having distinct homogeneous properties for different layers of the stack, the properties for the device can be more easily controlled than for a planar device. The CNTs in each layer are preferably aligned so that respective nanotubes will not intersect each other and will bridge source to drain with high probability. By having each carbon nanotube bridge source to drain and having a highly homogeneous carbon nanotube material each layer, the electrical characteristics can be controlled in the present invention to a much greater degree than in devices proposed in the prior art. A gate metal sandwich is used for optimal electrical characteristics such as gate voltage control and threshold voltages.

The resulting structure can be included within integrated circuit chips, which can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A ternary or higher level of multivalued logic device comprising:
    a gate structure containing a first layer of carbon nanotubes and a second layer of carbon nanotubes;
    the first and the second layers are stacked vertically and the first and the second layers have carbon nanotubes which have substantially homogeneous electric characteristics within each layer and the carbon nanotubes in the first layer have different electric characteristics than the carbon nanotubes in the second layer; and
    the gate structure produces a multiple threshold voltage when coupled to a voltage source and is incorporated in the ternary or higher level of multivalued logic device.

2. The device as recited in claim 1, wherein the carbon nanotubes are single walled carbon nanotubes and the carbon nanotubes in the first layer have different carbon nanotube diameters than the carbon nanotubes in the second layer, and the carbon nanotube diameters have been selected to achieve a desired threshold voltage.

3. The device as recited in claim 1, wherein the carbon nanotubes in each layer are chemically doped to achieve a desired threshold voltage.

4. The device as recited in claim 1, wherein the gate structure further comprises an insulator which sandwiches the carbon nanotubes and isolates the carbon nanotubes from a conductive gate material.

5. The device as recited in claim 4, wherein each layer of the gate structure is arranged to comprise a first dielectric layer, a layer of carbon nanotubes, a second dielectric layer and a conductive gate layer forming a top gate layer.

6. The device as recited in claim 4, in which the gate metal surrounds each layer of carbon nanotubes and provides a common gate electrode connection.

7. The device as recited in claim 1, further comprising a multilevel source electrode which is electrically coupled to a first end of each layer of carbon nanotubes and a multilevel drain electrode which is connected to a second end of each layer of carbon nanotubes, wherein the carbon nanotubes in each layer are arranged in a substantially parallel manner bridging from the multilevel source electrode to the multilevel drain electrode.

8. The device as recited in claim 1, further comprising:
a third layer of carbon nanotubes and a fourth layer of carbon nanotubes in the gate structure;
wherein the third and the fourth layers are stacked vertically with first and the second layers and the first and the third layers have carbon nanotubes which have substantially homogeneous electric characteristics and the second and the fourth layers have carbon nanotubes which have substantially homogeneous electric characteristics and the carbon nanotubes in the first and third layers have different electric characteristics than the carbon nanotubes in the second and fourth layers.

9. The device as recited in claim 1, wherein the device is a ternary logic device.

10. The device as recited in claim 1, wherein the multiple threshold voltage comprises a plurality of threshold voltages, each threshold voltage corresponding to a ternary or higher level of multivalued logic value.

11. The device as recited in claim 1, wherein each layer of carbon nanotubes has a substantially similar number of carbon nanotubes to control a total resistance of each layer.

12. The device as recited in claim 1, further comprising:
a third layer of carbon nanotubes in the gate structure;
wherein the third layer is stacked vertically with first and the second layers and the third layer has carbon nanotubes which have substantially homogeneous electric characteristics and third layers has different electric characteristics than the carbon nanotubes in the first and second layers: and
wherein the device is a quaternary device.

13. The device as recited in claim 1, wherein the electric characteristics for nanotubes in the first and second layers include a set of desired band gap and voltage threshold characteristics for the nanotubes in each respective layer.

14. The device as recited in claim 7, further comprising a first buried electrode located on a side of the device proximate to the multilevel source electrode and a second buried electrode located on a side of the device proximate to multilevel drain electrode, the first and second buried electrodes for aligning the carbon nanotubes in a fabrication step.

15. The device as recited in claim 1, wherein current flows in the first and second layers when respective threshold voltages are produced by the gate structure in normal operation of the device.

16. The device as recited in claim 12, further comprising:
a fourth layer of carbon nanotubes, a fifth layer of carbon nanotubes and a sixth layer of carbon nanotubes in the gate structure;
wherein the fourth, fifth and sixth layers are stacked vertically with the first, second and third layers and the first and the fourth layers have carbon nanotubes which have substantially homogeneous electric characteristics, the second and the fifth layers have carbon nanotubes which have substantially homogeneous electric characteristics and the third and the sixth layers have carbon nanotubes which have substantially homogeneous electric characteristics and the carbon nanotubes in the first and fourth layers have different electric characteristics than the carbon nanotubes in the second and fifth layers and the third and the sixth layers.

17. The device as recited in claim 4, wherein individual carbon nanotubes in each layer are surrounded by insulator in the gate structure.

18. The device as recited in claim 17, wherein individual carbon nanotubes in each layer are encased by the multilevel source electrode.

* * * * *